(12) United States Patent
Tsorng et al.

(10) Patent No.: US 11,716,824 B2
(45) Date of Patent: Aug. 1, 2023

(54) COVER APPARATUS

(71) Applicant: Quanta Computer Inc., Taoyuan (TW)

(72) Inventors: Yaw-Tzorng Tsorng, Taoyuan (TW); Ming-Lung Wang, Taoyuan (TW); Hung-Wei Chen, Taoyuan (TW); Liang-Ju Lin, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/548,022

(22) Filed: Dec. 10, 2021

(65) Prior Publication Data
US 2023/0109427 A1     Apr. 6, 2023

Related U.S. Application Data

(60) Provisional application No. 63/261,990, filed on Oct. 1, 2021.

(51) Int. Cl.
*H05K 5/03* (2006.01)
*H05K 5/02* (2006.01)
*H05K 7/14* (2006.01)

(52) U.S. Cl.
CPC ............. *H05K 5/03* (2013.01); *H05K 5/0226* (2013.01); *H05K 7/1488* (2013.01)

(58) Field of Classification Search
None
See application file for complete search history.

(56) References Cited

U.S. PATENT DOCUMENTS 6,038,892 A * 3/2000 Schmitt .................. E05C 17/04
                                                     292/303
6,157,540 A * 12/2000 Eddings .................. H05K 7/16
                                                     361/752

(Continued)

FOREIGN PATENT DOCUMENTS

CN      105960132 A      9/2016
CN      209929558 U      1/2020

(Continued)

OTHER PUBLICATIONS

TW Office Action for Application No. 111111786, dated Dec. 23, 2022, w/ First Office Action Summary.

(Continued)

*Primary Examiner* — James Wu
*Assistant Examiner* — Christopher L Augustin
(74) *Attorney, Agent, or Firm* — Nixon Peabody LLP

(57) ABSTRACT

A cover apparatus for controlling airflow in a computing system. The cover apparatus includes a cover bracket configured to attach to the computing system in alignment with an opening of a module within the computing system. The cover bracket defines an aperture through which one or more components can be inserted into and removed from the module. The cover apparatus includes a cover door attached to the cover bracket and configured to rotate relative to the cover bracket between an open position and a closed position. The cover door closes the first aperture of the cover bracket with the cover door in the closed position. The cover apparatus includes a catch configured to apply a force to the cover door in the closed position. The force is sufficient to maintain the cover door in the closed position but allows a user to manually open the cover door for accessing the module.

18 Claims, 13 Drawing Sheets

(56) References Cited

U.S. PATENT DOCUMENTS

| | | | | |
|---|---|---|---|---|
| 6,595,605 | B1* | 7/2003 | Babcock | G06F 1/181 |
| | | | | 292/87 |
| 8,498,119 | B2* | 7/2013 | Fan | E05C 1/04 |
| | | | | 361/724 |
| 10,624,223 | B1* | 4/2020 | Tsorng | H05K 7/20727 |
| 2003/0193774 | A1 | 10/2003 | Shyr | |
| 2005/0152106 | A1* | 7/2005 | Coster | H05K 5/0221 |
| | | | | 361/679.58 |
| 2006/0109618 | A1* | 5/2006 | Junkins | H05K 5/03 |
| | | | | 361/679.24 |
| 2011/0149524 | A1* | 6/2011 | Westphall | H05K 7/1425 |
| | | | | 312/294 |
| 2014/0002986 | A1* | 1/2014 | Guan | G06F 1/20 |
| | | | | 361/679.48 |
| 2015/0355686 | A1* | 12/2015 | Heyd | G11B 33/128 |
| | | | | 361/679.31 |
| 2016/0021778 | A1* | 1/2016 | Chen | H05K 7/1487 |
| | | | | 361/679.39 |

FOREIGN PATENT DOCUMENTS

KR         900004080 Y1 *   5/1990
KR           0127766 Y1 * 12/1998

OTHER PUBLICATIONS

TW Search Report for Application No. 111111786, dated Dec. 23, 2022, w/ First Office Action.

* cited by examiner

COVER APPARATUS

CROSS-REFERENCE TO RELATED APPLICATIONS

This application claims priority under 35 U.S.C. § 119 to and the benefit of U.S. Provisional Patent Application Ser. No. 63/261,990, filed on Oct. 1, 2021, and titled "Consumer Electronic Server Cooling Cover Design," which is incorporated herein by reference in its entirety.

FIELD OF THE INVENTION

The present invention relates generally to an apparatus for controlling airflow within a computing system, and more specifically, to a cover apparatus that prevents the recirculation of airflow from outside of a chassis of a computing system.

BACKGROUND OF THE INVENTION

Heat dissipation is one of the primary concerns in the design of computing systems, and particularly server computing systems. Another concern is the convenience of maintenance of the computing systems. Such maintenance can include accessing components within the computing systems, such as hot-swappable storage components.

In the past, traditional computing systems needed more fans to improve the airflow for providing heat dissipation. However, an increase in the number of fans leads to an increase in the size of the computing system, such as the length of the chassis of the computing system. Further, the increase in the number of fans and the increase in the size of the computing system lead to an increase in the overall cost, among other issues. These issues are further explored with respect to FIGS. 1 and 2 disclosed below.

FIG. 1 shows a schematic view of airflow within a conventional computing system 100. The computing system 100 includes internal components 102, such as a motherboard with one or more processors. The components 102 generate heat within the computing system 100, and the heat must be dissipated to avoid heat-related issues. To dissipate the heat, the computing system 100 includes a fan bank 104. The fan bank 104 can include one or more discrete fans for cooling the computing system 100.

The computing system 100 further includes a power supply unit 106 that is configured to supply power to the components 102 of the computing system 100. The power supply unit 106 can also be a large source of heat within the computing system 100. As shown in the illustrated embodiment, the power supply unit 106 can include a dedicated external fan 108 that can be separate from any dedicated fan within the power supply unit 106 itself.

The computing system 100 further includes a module 110, such as a hard disk module, that is configured to contain one or more components, such as hard disks. The module 110 has an opening on the side 110a facing out of the computing system 100, which allows a user to insert and remove components (e.g., hard disks) from the module 110.

Airflow, represented by the arrows 112, is directed out of the computing system 100 by the fan bank 104 for cooling the computing system 100. Further, because the computing system 100 includes the fan 108 dedicated to the power supply unit 106, the fan 108 forces the airflow 112 out the open side 110a of the module 110. However, the fan 108 requires additional space, power, and cost, among other requirements. Thus, not all conventional computing systems include the external fan 108 dedicated to the power supply unit 106. This can lead to issues.

FIG. 2 shows a schematic view of the airflow within another conventional computing system 200 that lacks a dedicated external fan (fan 108 in FIG. 1) for a power supply unit. Like, the computing system 100 of FIG. 1, the computing system 200 includes internal components 202, such a motherboard with one or more processors, and fan bank 204, which includes one or more fans for cooling the computing system 200. The computing system 200 further includes a power supply unit 206 that is configured to supply power to the computing system 200. The computing system 200 further includes a module 210, such as a hard disk module, that is configured to contain one or more components, such as one or more hard disks. The module 210 has an opening on the side 210a facing out of the computing system 200, which allows components to be inserted into and withdrawn from the module 210.

Airflow, represented by the arrows 212, is directed out of the computing system 200 by the fan bank 204 for cooling the computing system 200. However, the power supply unit 206 does not include a dedicated external fan. As a result, airflow, represented by the arrow 214, escaping the computing system 200 may be recirculated back into the computing system 200 through the opening in the side 210a of the module 210. The recirculating airflow 214 can increase the temperature within the computing system 200 because a quantity of air is being reheated rather than completely escaping the computing system 200. The higher temperature air can cause the components 202 to fail. The recirculating airflow 214 may also decrease the overall airflow within the computing system 200. This may require additional fans to increase the overall airflow, which can increase the cost of the computing system 200, increase the overall size of the computing system 200, or reduce the space within the computing system 200 that can be used for something other than fans.

The present disclosure is directed to solving the above problems found in conventional computing systems, such as the conventional computing systems 100 and 200, by controlling airflow through an opening of a module within the computing systems.

SUMMARY OF THE INVENTION

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to one embodiment of the present disclosure, a cover apparatus is disclosed. The cover apparatus is configured to control airflow of a computing system. In particular, the cover apparatus is configured to limit airflow from entering or escaping through an opening of a module of the computing system.

The cover apparatus includes a cover bracket configured to attach to a chassis of the computing system in alignment with the opening of the module housed within the chassis of the computing system. The cover bracket defines a first aperture through which one or more components can be inserted into and removed from the module. The cover apparatus further includes a cover door attached to the cover bracket and configured to rotate relative to the cover bracket between an open position and a closed position. The cover door closes the first aperture of the cover bracket in the closed position to restrict or limit airflow through the opening. The cover apparatus further includes a catch configured to apply a force to the cover door in the closed position. The force is sufficient to maintain the cover door in the closed position but allows a user to manually open the cover door for accessing the module simply by overcoming the force, such as by rotating the cover door.

According to one aspect of the above embodiment, the cover bracket includes a cover frame configured to attach to the chassis of the computing system and a door frame configured to couple the cover door to the cover frame. According to another aspect of the above embodiment, the door frame includes a first hinge, the cover door includes a second hinge, and the first hinge cooperates with the second hinge to couple the cover door to the door frame. According to another aspect of the above embodiment, the cover apparatus further includes a pin that extends through the first hinge and the second hinge to couple the cover door to the door frame. According to another aspect of the above embodiment, the door frame defines a second aperture through which the one or more components can be inserted into and removed from the module. The second aperture is smaller than the first aperture, and the second aperture matches a profile of the opening of the module. According to another aspect of the above embodiment, the cover door includes a handle for a user to grip when manually opening the cover door. According to another aspect of the above embodiment, the cover door includes a flange that interacts with the catch for applying the force to the cover door in the closed position. According to another aspect of the above embodiment, the catch includes a magnet, and the flange is made of a magnetic material. According to another aspect of the above embodiment, the cover bracket includes a second aperture, and the catch is a quarter-turn knob configured to engage the second aperture to apply the force to the cover door in the closed position. According to another aspect of the above embodiment, the cover bracket includes a pair of pins that couple the cover door to the cover bracket, and the cover door is configured to rotate relative to the cover bracket about the pair of pins. According to another aspect of the above embodiment, the cover door includes a pair of slots on opposite lateral sides of the cover door, and the pair of pins engage with the pair of slots. According to another aspect of the above embodiment, the cover door is configured to at least partially slide through the first aperture and into the chassis of the computing system by the pair of pins sliding along the pair of slots of the cover door.

According to another embodiment of the present disclosure, a computing system is disclosed. The computer system includes a chassis and a module housed within the chassis. The module includes an opening and is configured to retain one or more components that can be inserted into and removed from the opening. The computer system further includes a cover apparatus. The cover apparatus includes a cover bracket configured to attach to the chassis in alignment with the opening of the module. The cover bracket defines a first aperture through which the one or more components can be inserted into and removed from the module. The cover apparatus further includes a cover door attached to the cover bracket and configured to rotate relative to the cover bracket between an open position and a closed position. The cover door closes the first aperture of the cover bracket with the cover door in the closed position. The cover apparatus further includes a catch configured to apply a force to the cover door in the closed position. The force is sufficient to maintain the cover door in the closed position but allows a user to manually open the cover door for accessing the module.

According to one aspect of the above embodiment, the cover bracket includes a cover frame configured to attach to the chassis of the computing system and a door frame configured to couple the cover door to the cover frame. According to another aspect of the above embodiment, the door frame includes a first hinge, the cover door includes a second hinge, and the first hinge cooperates with the second hinge to couple the cover door to the door frame. The cover apparatus further includes a pin that extends through the first hinge and the second hinge to couple the cover door to the door frame. According to another aspect of the above embodiment, the door frame defines a second aperture through which the one or more components can be inserted into and removed from the module. The second aperture is smaller than the first aperture, and the second aperture matches a profile of the opening of the module. According to another aspect of the above embodiment, the cover door includes a flange that interacts with the catch for applying the force to the cover door in the closed position. The catch comprises a magnet, and the flange is made of a magnetic material. According to another aspect of the above embodiment, the cover bracket includes a second aperture, and the catch is a quarter-turn knob configured to engage the second aperture to apply the force to the cover door in the closed position. According to another aspect of the above embodiment, the cover bracket comprises a pair of pins that couple the cover door to the cover bracket, and the cover door is configured to rotate relative to the cover bracket about the pair of pins. According to another aspect of the above embodiment, the cover door comprises a pair of slots on opposite lateral sides of the cover door. The pair of pins engage with the pair of slots, and the cover door is configured to at least partially slide through the first aperture and into the chassis of the computing system by the pair of pins sliding along the pair of slots of the cover door.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

Figure 1:
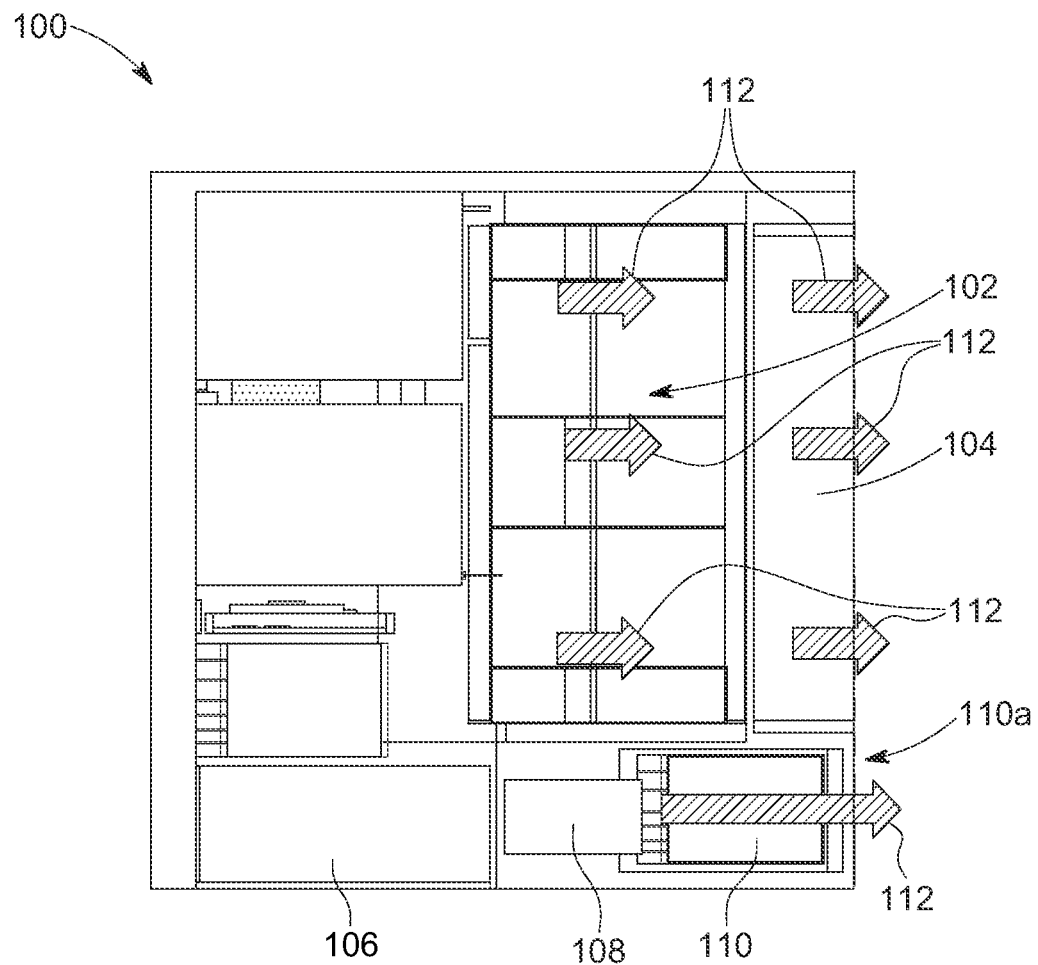
FIG. 1 shows a schematic view of airflow within a conventional computing system.

While the invention is susceptible to various modifications and alternative forms, specific embodiments have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," "generally," and the like, can be used herein to mean "at," "near," or "nearly at," or "within 3-5% of," or "within acceptable manufacturing tolerances," or any logical combination thereof, for example.

Figure 3A:
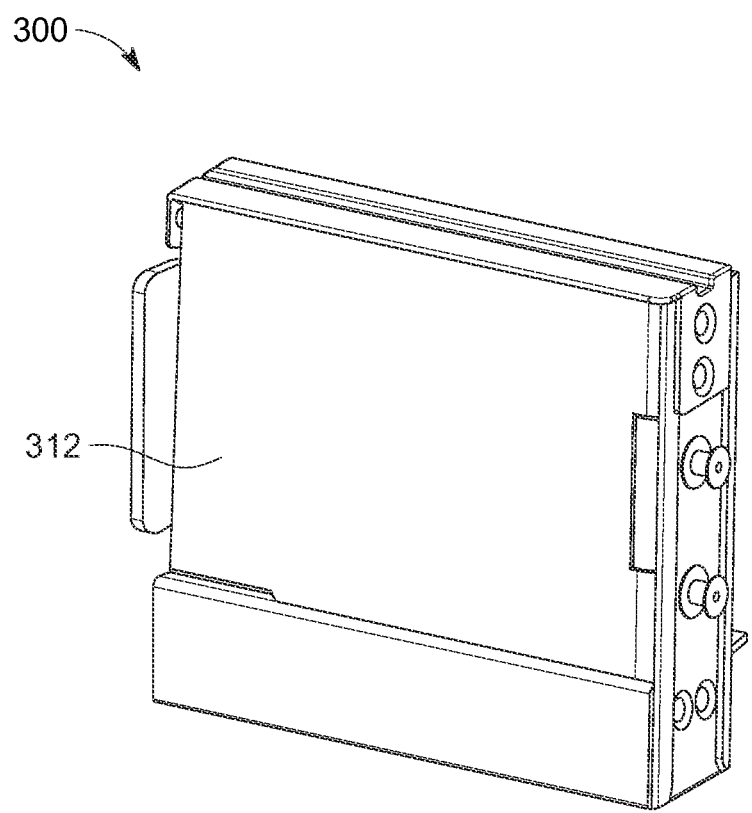
FIG. 3A shows a perspective view of a cover apparatus, according to an embodiment of the present disclosure.

FIG. 3A shows a perspective view of a cover apparatus 300, according to an aspect of the present disclosure. The cover apparatus 300 includes a cover door 312 that can open and close. In the closed position, as shown in FIG. 3A, the cover door 312 prevents airflow from recirculating into a computing system that contains the cover apparatus 300, as described below with respect to FIG. 5.

Figure 3B:
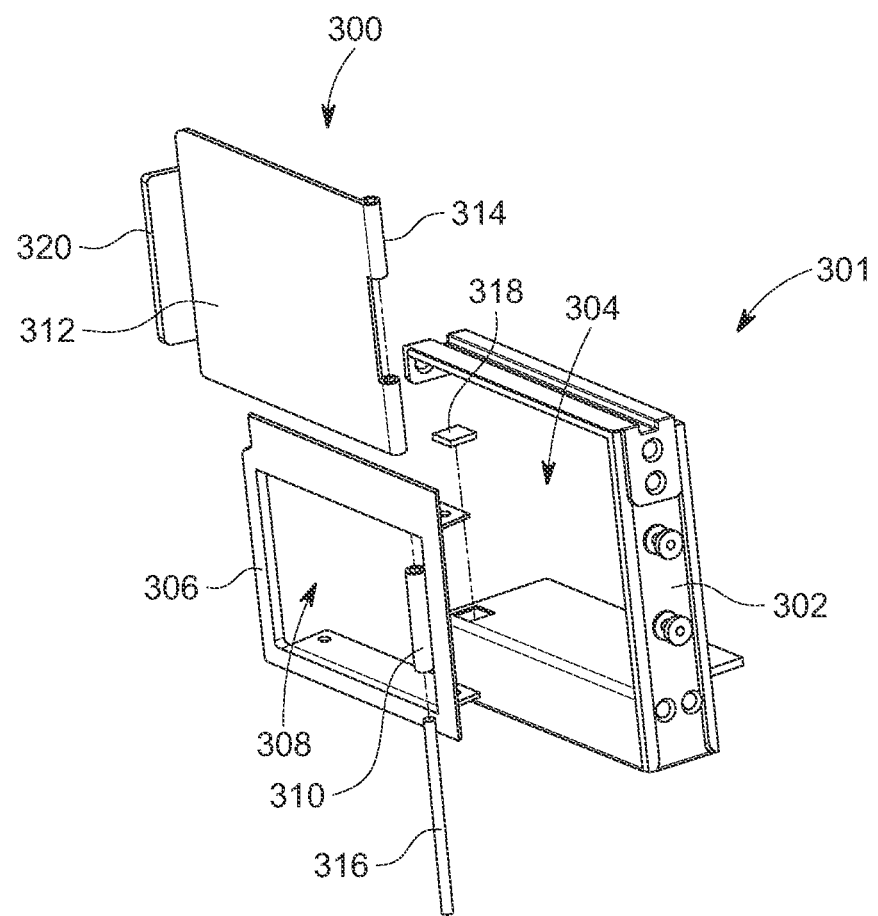
FIG. 3B shows an exploded view of a cover apparatus, according to an embodiment of the present disclosure.

FIG. 3B shows an exploded view of the cover apparatus 300, according to an aspect of the present disclosure. The cover apparatus 300 includes a cover bracket 301. The cover bracket 301 includes a cover frame 302 that is configured to connect to a chassis (402 in FIGS. 4A and 4B) of a computing system (400 in FIGS. 4A and 4B). The cover frame 302 defines a first aperture 304.

The cover bracket 301 further includes a door frame 306. The door frame 306 couples to the cover frame 302. However, in one or more embodiments, the cover bracket 301 can be a single piece, such that the door frame 306 and the cover frame 302 are a single piece and not referred to individually. The door frame 306 defines a second aperture 308. The second aperture 308 is generally aligned with the first aperture 304 of the cover frame 302. The second aperture 308 generally defines a space through which a component can pass through the cover apparatus 300 for being inserted into and removed from a computing system, as discussed below with respect to FIGS. 4A and 4B. The door frame 306 includes a hinge 310.

Figure 4A:
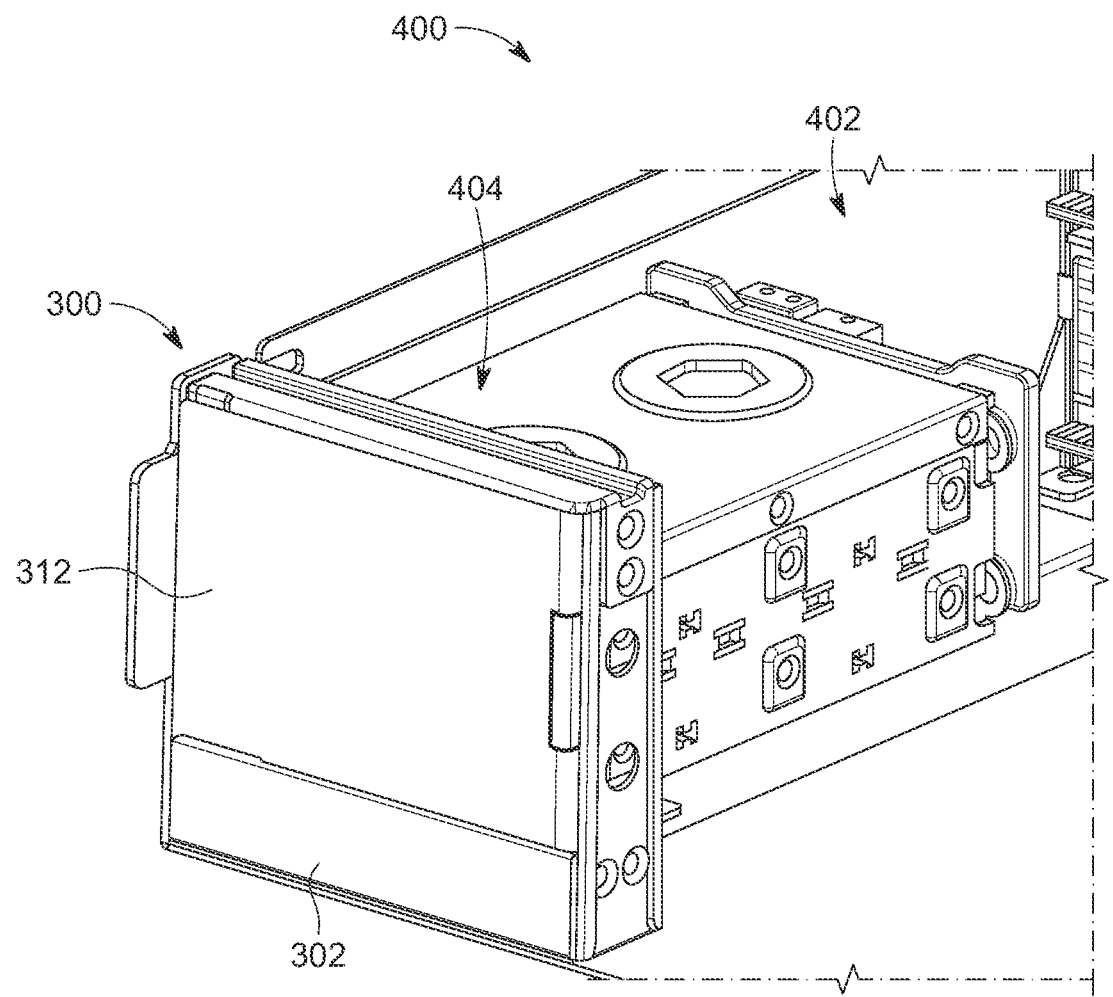
FIG. 4A shows a perspective view of a cover apparatus in a closed position within a computing system, according to an embodiment of the present disclosure.

The cover apparatus 300 further includes a cover door 312. The cover door 312 includes a hinge 314. The hinge 314 of the cover door 312 and the hinge 310 of the door frame 306 both accept a pin 316 that extends therethrough to couple the cover door 312 to the door frame 306. The pin 316 allows the cover door 312 to rotate relative to the door frame 306 for opening and closing the cover door 312, which covers and uncovers the second aperture 308. Further, the cover door 312 is sized to substantially cover the second aperture 308 in the closed position (FIG. 4A).

Rather than hinges 310 and 314 and the pin 316 arrangement, the door frame 306 and the cover door 312 can have various other configurations that allow the cover door 312 to rotate relative to the door frame 306.

Figure 4B:
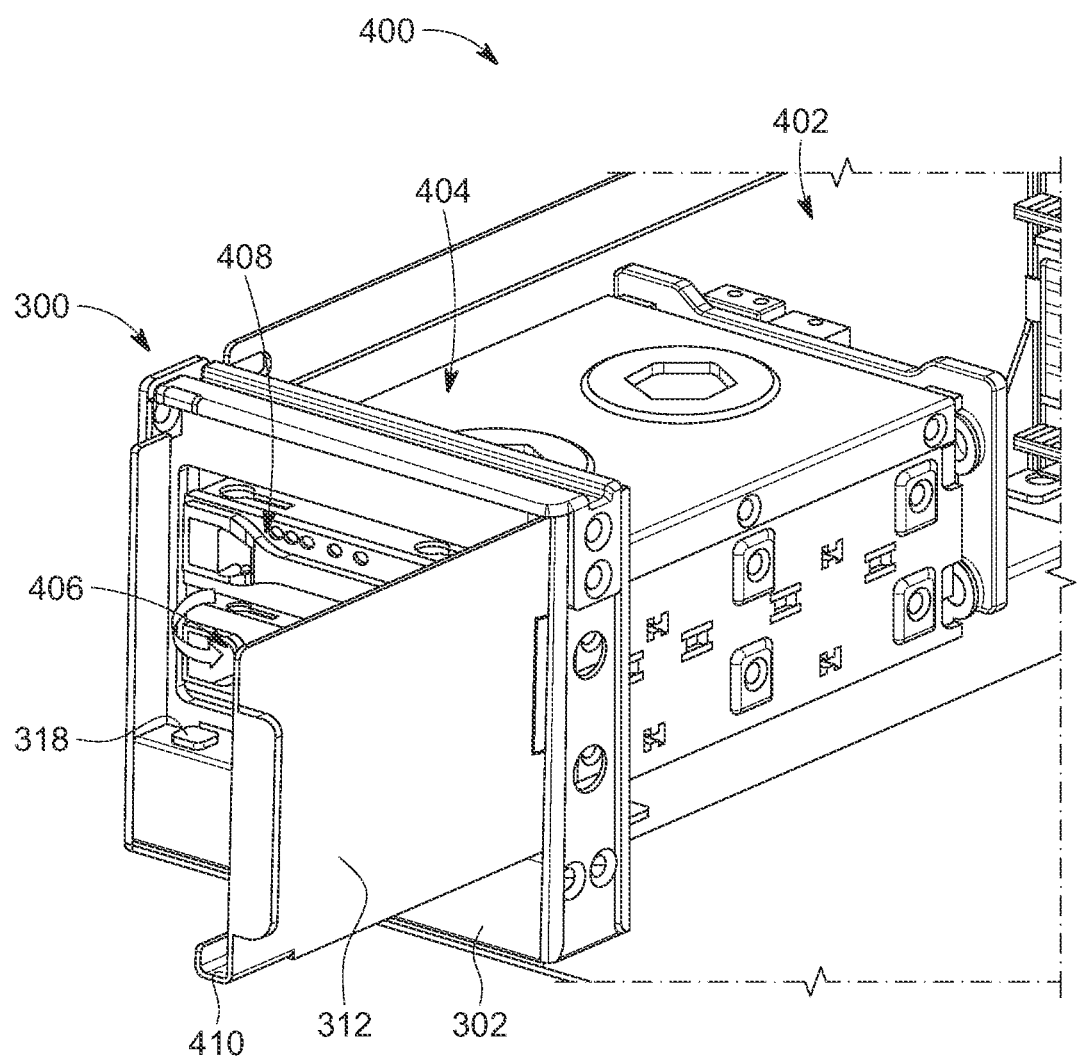
FIG. 4B shows a perspective view of a cover apparatus in an open position within a computing system, according to an embodiment of the present disclosure.

In one or more embodiments, the cover frame 302 can include a magnet 318. The magnet 318 applies a force to the cover door 312. The force is sufficient to maintain the cover door 312 in the closed position but allows a user to manually open the cover door 312 for accessing the module (FIGS. 4A and 4B). Thus, the magnet 318 can prevent or limit the cover door 312 from opening as a result of a pressure differential between inside and outside of a computing system that includes the cover apparatus 300, as discussed below for FIG. 5.

Instead of the magnet 318, alternatively the cover frame 302 can include any other type of releasable catch, such as a latch, a detent, a releasable pin, etc. that can hold the cover door 312 in the closed position but allow a user to release the catch. As a result, the cover door 312 can be opened without the need for any tool (screwdriver, pliers, etc.). The cover door 312 further can be closed and retained in the closed position by the catch (e.g., magnet 318) without the need for any tool (screwdriver, pliers, etc.).

In one or more embodiments, the cover door 312 can include a handle 320. The handle 320 allows a user to grip the cover door 312 to rotate the cover door 312 between the closed and open positions.

FIGS. 4A and 4B show perspective views of the cover apparatus 300 within a computing system 400 in a closed position (FIG. 4A) and an open position (FIG. 4B), according to aspects of the present disclosure. Specifically, the computing system 400 includes a chassis 402. The chassis 402 includes a module 404, such as a hard disk module, that houses components 408 within the computing system 400, such as hard disks. However, the module 404 can be configured to house any type of removable component of the computing system 400.

The cover apparatus 300 is coupled to the chassis 402 to cover the module 404. Specifically, the cover frame 302 is coupled to the chassis 402 to be aligned with the module 404. In the open position, as shown in FIG. 4B, the cover door 312 does not cover an opening 406 in the module 404 through which the components 408 can be inserted and removed. The second aperture 308 of the door frame 306 is sized to be generally the same size and profile as the opening 406 in the module 404. In the closed position, as shown in FIG. 4A, the cover door 312 covers the opening 406 in the module 404 and restricts or limits airflow that would otherwise pass through the opening 406.

As shown in FIG. 4B, in one or more embodiments, the cover door 312 can include a flange 410. The flange 410 is configured to override the magnet 318 with the cover door 312 in the closed position. Thus, the flange 410 is made of a magnetic material to interact with the magnet 318, so that the magnet 318 can apply the force to the flange 410 for resisting the cover door 312 from opening. The flange 410 can be generally flat to override the magnet 318. However, the flange 410 can have various other shapes depending on the style of the catch used in place of the specific magnet-catch arrangement of the magnet 318 or for the magnet 318.

Figure 5:
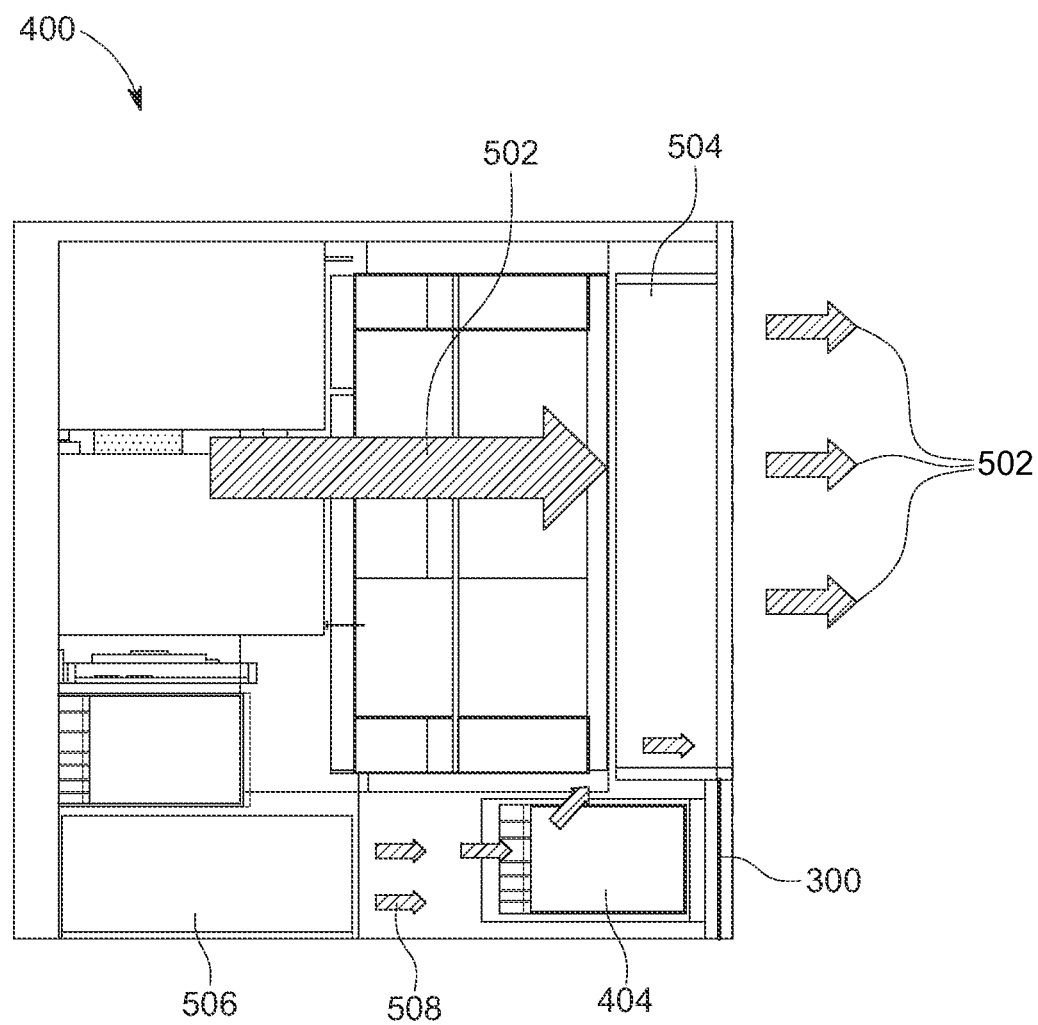
FIG. 5 shows a schematic view of airflow within a computing system that includes a cover apparatus, according to an embodiment of the present disclosure.

FIG. 5 shows a schematic view of airflow, represented by arrows 502, within the computing system 400 with the cover apparatus 300, according to an aspect of the present disclosure. The computing system 400 includes a fan bank 504 that generates the airflow 502, through the computing system 400. The computing system 400 further includes a power supply unit 506. The power supply unit 506 can include its own fan to generate airflow, represented by arrows 508. Alternatively, the fan bank 504 can generate the airflow 508 for cooling the power supply unit 506. In line with the power supply unit 506 within the computing system 400 is the module 404.

Figure 2:
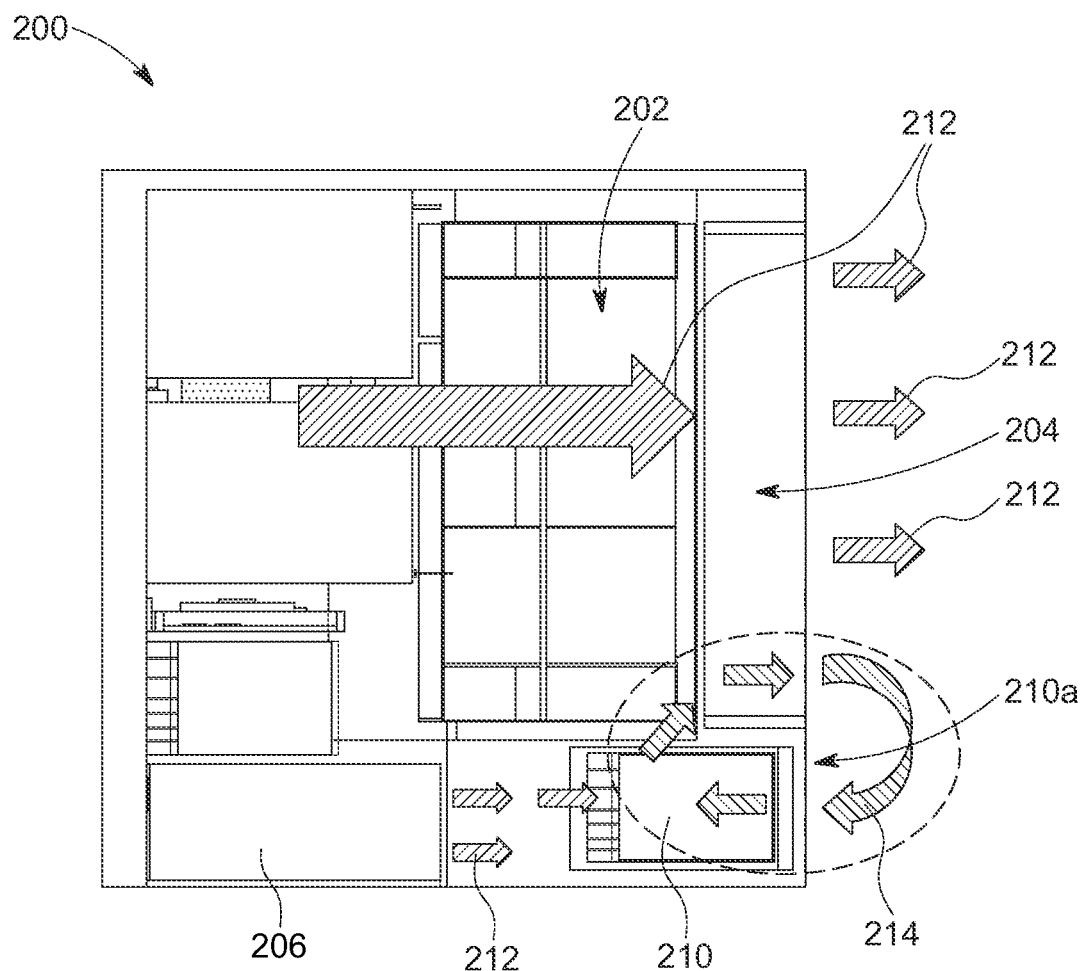
FIG. 2 shows a schematic view of airflow within another conventional computing system.

Without the cover apparatus 300 in the computing system 400, the airflow 508 would recirculate back into the computing system 400, as is the case for the conventional computing system 200 in FIG. 2. However, with the cover apparatus 300 in the computing system 400 in the closed position (FIG. 3A), the cover apparatus 300 restricts the airflow 508 from recirculating back into the computing system 400 through the module 404. Preventing the airflow 508 from recirculating back into the computing system 400 reduces the likelihood of, for example, the computing system 400 overheating and/or not receiving enough airflow.

Figure 6A:
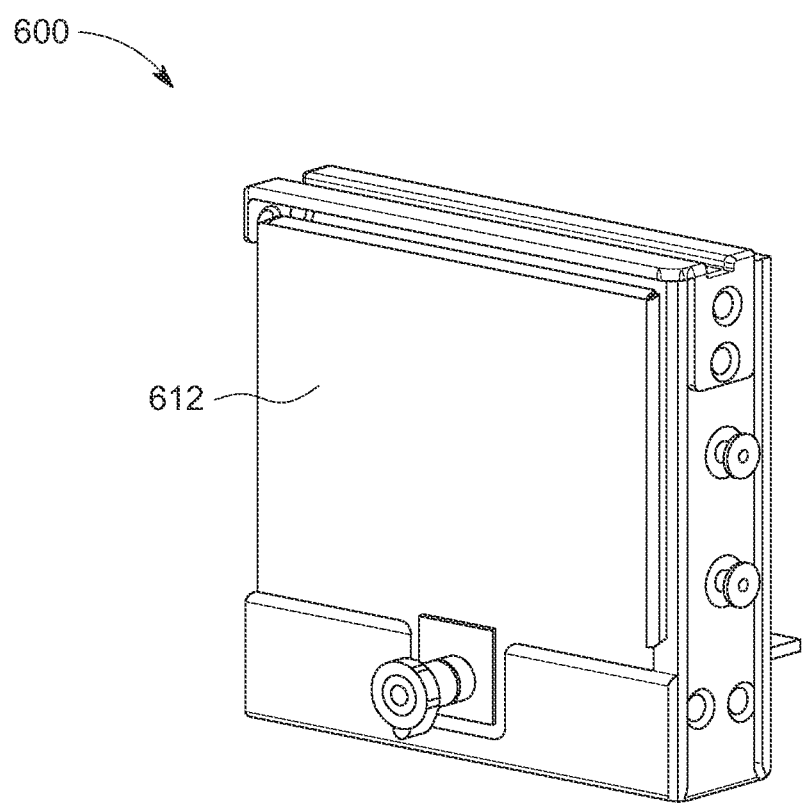
FIG. 6A shows a perspective view of an alternative cover apparatus, according to another embodiment of the present disclosure.

FIG. 6A shows a perspective view of another cover apparatus 600, according to another aspect of the present disclosure. Similar to the cover apparatus 300, the cover apparatus 600 includes a cover door 612 that can open and close. In the closed position, the cover door 612 restricts airflow from recirculating into a computing system, as described above with respect to FIG. 5. However, the configuration that allows the cover door 612 to open and close is different than the cover door 312, as disclosed below.

Figure 6B:
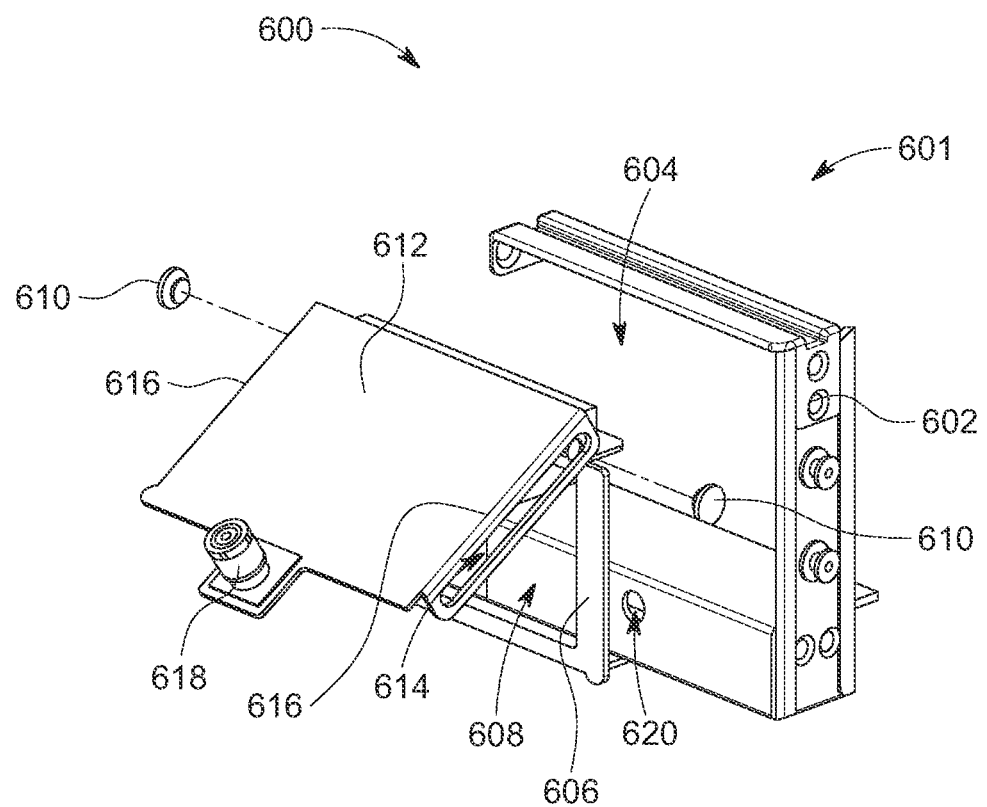
FIG. 6B shows an exploded view of an alternative cover apparatus, according to another embodiment of the present disclosure.

FIG. 6B shows an exploded view of the cover apparatus 600, according to another aspect of the present disclosure. Similar to the cover apparatus 300, the cover apparatus 600 includes a cover bracket 601. The cover bracket 601 includes a cover frame 602 that is configured to connect to a chassis (702 in FIGS. 7-10) of a computing system (700 in FIGS. 7-10). The cover frame 602 defines a first aperture 604.

The cover bracket 601 further includes a door frame 606. The door frame 606 couples to the cover frame 602. However, in one or more embodiments, the cover bracket 601 can be a single piece, such that the door frame 606 and the cover frame 602 are a single piece and not referred to individually. The door frame 606 defines a second aperture 608. The second aperture 608 is generally aligned with the first aperture 604 of the cover frame 602. The second aperture 608 generally defines a space through which a component can pass through the cover apparatus 600 for being inserted into and removed from a computing system, as discussed below with respect to FIGS. 7-10.

The door frame 606 includes two pins 610. The pins 610 couple the cover door 612 to the door frame 606 and act as a hinge that allows the cover door 612 to rotate relative to the door frame 606, as further disclosed below.

The cover door 612 includes slots 614 on opposite lateral sides 616 of the cover door 612. The slots 614 engage with the pins 610 to allow the cover door 612 to rotate relative to the door frame 606 and also slide through the first aperture 604 of the cover frame 602.

The cover door 612 further includes a releasable latch 618. The latch 618 secures the cover door 612 in the closed position, as shown in FIG. 6A. In one or more embodiments, the latch 618 can be a quarter-turn latch that is configured to engage an aperture 620 in the cover frame 602. The quarter-turn latch 618 allows a user to release the cover door 612 from the door frame 606 by turning the latch 618 in one direction (e.g., clockwise). The quarter-turn latch 618 further allows a user to secure the cover door 612 to the door frame 606 by rotating the latch 618 in the opposite direction (e.g., counter-clockwise).

With the cover door 612 in the open position (FIG. 10), one or more components can be passed through the apertures 604 and 608 for being inserted into or removed from a computing system that includes the cover apparatus 600 (FIGS. 7-10). With the cover door 612 in the closed position (FIG. 6A), the cover door 612 prevents airflow from recirculating back into the computing system.

Figure 7:
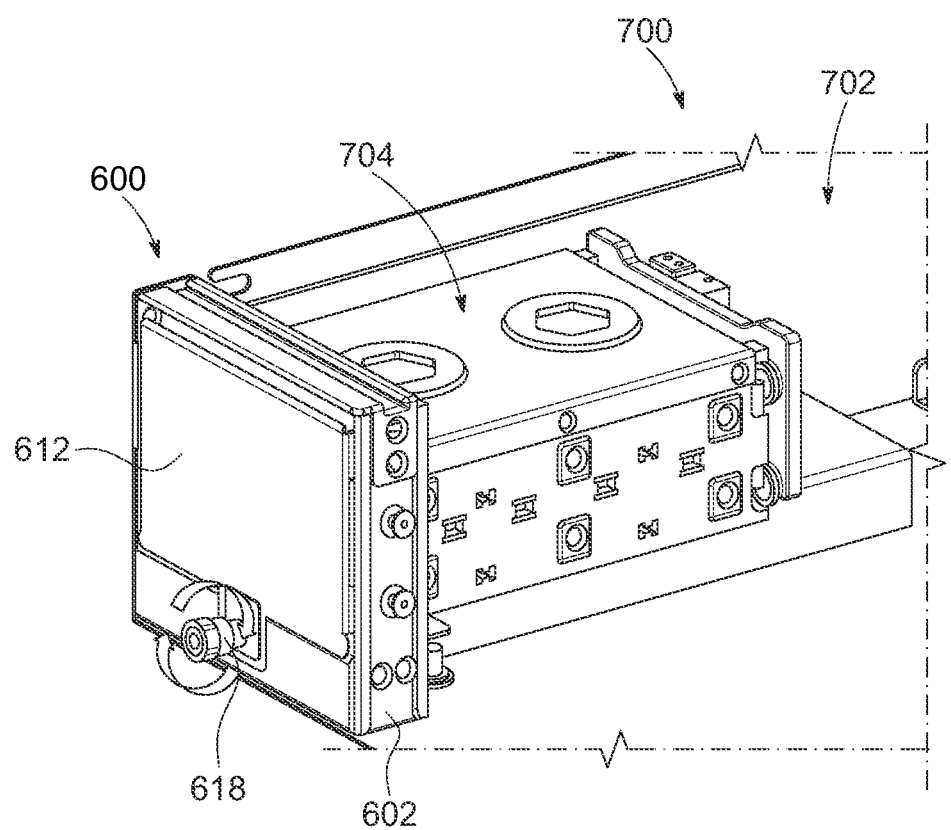
FIG. 7 shows a perspective view of an alternative cover apparatus in a closed position within a computing system, according to an embodiment of the present disclosure.

FIG. 7 shows a perspective view of the cover apparatus 600 in a closed position within a computing system 700, according to an aspect of the present disclosure. The computing system 700 includes a chassis 702. The chassis 702 includes a module 704, such as a hard disk module, that houses components within the computing system 700, such as hard disks. However, the module 704 can alternatively house any other removable component of the computing system 700. The cover apparatus 600 is coupled to the chassis 702 so as to cover the module 704. Specifically, the cover frame 602 is coupled to the chassis 702 to be aligned with the module 704. FIG. 7 shows the cover door 612 in the closed position. The latch 618 can be configured in the closed position to restrict the cover door 612 from opening.

Figure 8:
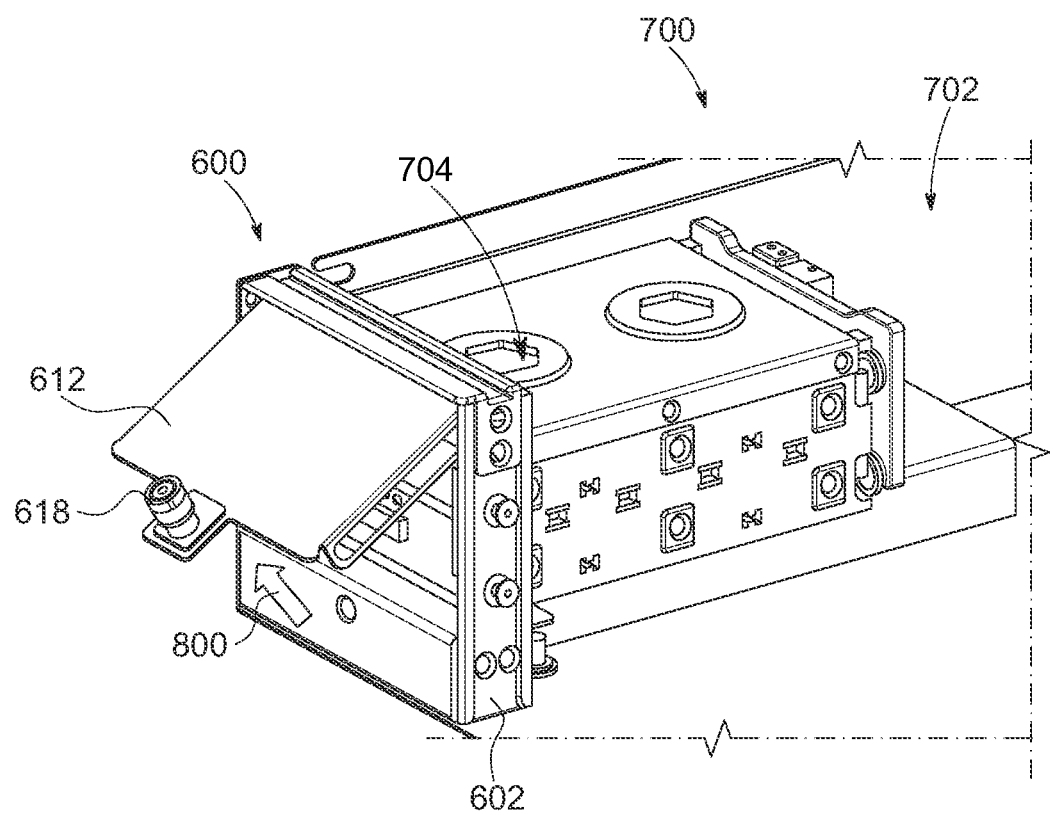
FIG. 8 shows a perspective view of a step in opening the alternative cover apparatus, according to an embodiment of the present disclosure.

FIG. 8 shows a perspective view of a first step in opening the cover apparatus 600, according to an aspect of the present disclosure. The latch 618 can be turned to release the cover door 612. This allows the cover door 612 to rotate in the direction of arrow 800 about the pins 610 (FIG. 6B).

Figure 9:
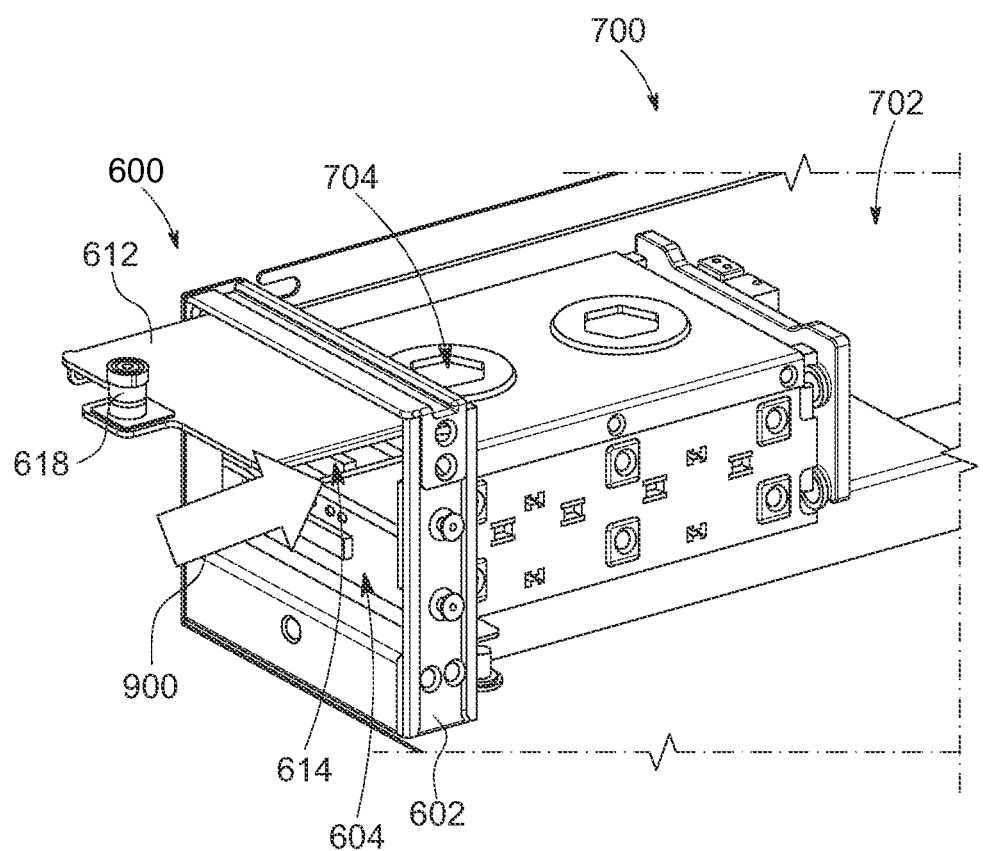
FIG. 9 shows a perspective view of another step in opening the alternative cover apparatus, according to an embodiment of the present disclosure.

FIG. 9 shows a perspective view of another step in opening the cover apparatus 600, according to an aspect of the present disclosure. Once the cover door 612 becomes generally horizontal, as shown in FIG. 9, the cover door 612 can slide in the direction of arrow 900 through the first aperture 604 defined by the cover frame 602 and into the chassis 702. The cover door 612 slides along the slots 614 engaged with the pins 610 (FIG. 6B).

Figure 10:
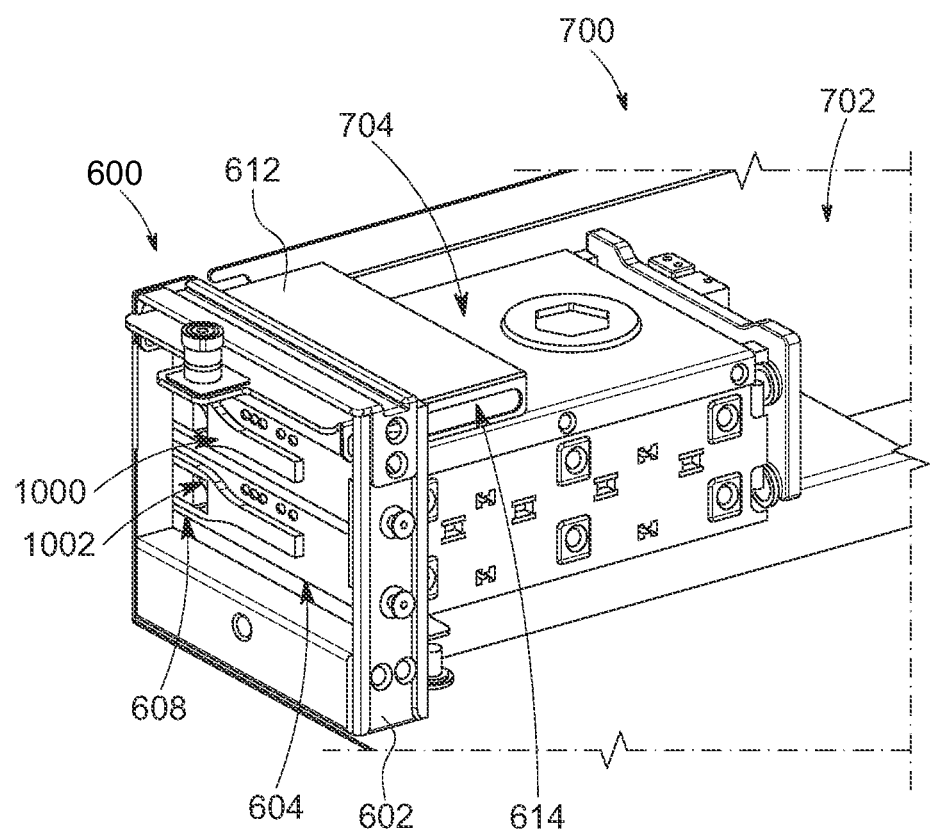
FIG. 10 shows a perspective view of an alternative cover apparatus in an open position within a computing system, according to an embodiment of the present disclosure.

FIG. 10 shows a perspective view of another step in opening the cover apparatus 600, according to an aspect of the present disclosure. The cover door 612 is in the open position in FIG. 10 by being generally fully inserted into the first aperture 604 of the cover frame 602. The cover door 612 being in the open position allows components 1000 to be inserted into and withdrawn from the module 704 through an opening 1002 in the module 704. The second aperture 608 of the door frame 606 is sized to be generally the same size as the opening 1002 in the module 704. The cover door 612 being generally fully inserted into the first aperture 604 of the cover frame 602 reduces a likelihood that the cover door 612 is in the way when accessing the components 1000, as compared to, for example, the cover door 312.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the disclosed embodiments have been illustrated and described with respect to one or more embodiments, equivalent alterations and modifications will occur or be known to others skilled in the art upon the reading and understanding of this specification and the annexed drawings. In addition, while a particular feature of the invention may have been disclosed with respect to only one of several embodiments, such feature may be combined with one or more other features of the other embodiments as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A cover apparatus comprising:
a cover bracket configured to attach to a chassis of a computing system in alignment with an opening of a module housed within the chassis of the computing system, the cover bracket defining a first aperture through which one or more components can be inserted into and removed from the module;
a cover door attached to the cover bracket and configured to rotate relative to the cover bracket between an open position and a closed position, the cover door closing the first aperture of the cover bracket with the cover door in the closed position, the cover bracket including a cover frame configured to attach to the chassis of the computing system and a door frame configured to couple the cover door to the cover frame, the cover frame and the door frame being separable features from each other; and
a catch configured to apply a force to the cover door in the closed position, the force being sufficient to maintain the cover door in the closed position but allow a user to manually open the cover door for accessing the module.

2. The cover apparatus of claim 1, wherein the door frame includes a first hinge, the cover door includes a second hinge, and the first hinge cooperates with the second hinge to couple the cover door to the door frame.

3. The cover apparatus of claim 2, further comprising a pin that extends through the first hinge and the second hinge to couple the cover door to the door frame.

4. The cover apparatus of claim 1, wherein the door frame defines a second aperture through which the one or more components can be inserted into and removed from the module, the second aperture is smaller than the first aperture, and the second aperture matches a profile of the opening of the module.

5. The cover apparatus of claim 1, wherein the cover door includes a handle for the user to grip when manually opening the cover door.

6. The cover apparatus of claim 1, wherein the cover door includes a flange that interacts with the catch for applying the force to the cover door in the closed position.

7. The cover apparatus of claim 6, wherein the catch includes a magnet, and the flange is made of a magnetic material.

8. The cover apparatus of claim 1, wherein the cover bracket includes a second aperture, and the catch is a quarter-turn latch configured to engage the second aperture to apply the force to the cover door in the closed position.

9. The cover apparatus of claim 1, wherein the cover bracket includes a pair of pins that couple the cover door to the cover bracket, and the cover door is configured to rotate relative to the cover bracket about the pair of pins.

10. The cover apparatus of claim 9, wherein the cover door includes a pair of slots on opposite lateral sides of the cover door, and the pair of pins engage with the pair of slots.

11. The cover apparatus of claim 10, wherein the cover door is configured to at least partially slide through the first aperture and into the chassis of the computing system by the pair of pins sliding along the pair of slots of the cover door.

12. A computing system comprising:
a chassis;
a module housed within the chassis, the module including an opening, the module being configured to retain one or more components that can be inserted into and removed from the opening; and
a cover apparatus including:
a cover bracket configured to attach to the chassis in alignment with the opening of the module, the cover bracket defining a first aperture through which the one or more components can be inserted into and removed from the module;
a cover door attached to the cover bracket and configured to rotate relative to the cover bracket between an open position and a closed position, the cover door closes the first aperture of the cover bracket with the cover door in the closed position, the cover bracket includes a cover frame configured to attach to the chassis of the computing system and a door frame configured to couple the cover door to the cover frame, the cover frame and the door frame being separable features from each other; and
a catch configured to apply a force to the cover door in the closed position, the force being sufficient to maintain the cover door in the closed position but allow a user to manually open the cover door for accessing the module.

13. The computing system of claim 12, wherein the door frame includes a first hinge, the cover door includes a second hinge, and the first hinge cooperates with the second hinge to couple the cover door to the door frame, and the cover apparatus further comprises a pin that extends through the first hinge and the second hinge to couple the cover door to the door frame.

14. The computing system of claim 12, wherein the door frame defines a second aperture through which the one or more components can be inserted into and removed from the module, the second aperture is smaller than the first aperture, and the second aperture matches a profile of the opening of the module.

15. The computing system of claim 12, wherein the cover door includes a flange that interacts with the catch for applying the force to the cover door in the closed position, the catch comprises a magnet, and the flange is made of a magnetic material.

16. The computing system of claim 12, wherein the cover bracket includes a second aperture, and the catch is a quarter-turn knob configured to engage the second aperture to apply the force to the cover door in the closed position.

17. The computing system of claim 12, wherein the cover bracket includes a pair of pins that couple the cover door to the cover bracket, and the cover door is configured to rotate relative to the cover bracket about the pair of pins.

18. The computing system of claim 17, wherein the cover door includes a pair of slots on opposite lateral sides of the cover door, the pair of pins engage with the pair of slots, and the cover door is configured to at least partially slide through the first aperture and into the chassis of the computing system by the pair of pins sliding along the pair of slots of the cover door.

* * * * *